United States Patent [19]
Cheng et al.

[11] Patent Number: 6,078,277
[45] Date of Patent: Jun. 20, 2000

[54] ARRANGEMENT AND METHOD FOR PRODUCING A PLURALITY OF PULSE WIDTH MODULATED SIGNALS

[75] Inventors: Eric Cheng, Ma On Shan; Hing Leung Yiu, Kwai Chung; Karson Chan, Tsuen Wan, all of The Hong Kong Special Administrative Region of the People's Republic of China

[73] Assignee: Motorola, Inc., Schaumburg, Ill.

[21] Appl. No.: 09/109,719

[22] Filed: Jul. 2, 1998

[51] Int. Cl.[7] .................................................. H03M 1/82
[52] U.S. Cl. ........................ 341/152; 341/144; 341/141
[58] Field of Search .................................... 341/152, 144, 341/141

[56] References Cited

U.S. PATENT DOCUMENTS

| | | | |
|---|---|---|---|
| 4,992,792 | 2/1991 | Mori et al. | 341/147 |
| 5,021,788 | 6/1991 | Uecki et al. | 341/152 |
| 5,148,168 | 9/1992 | Masuda et al. | 341/152 |
| 5,337,338 | 8/1994 | Sutton et al. | 377/33 |
| 5,406,284 | 4/1995 | Lin et al. | 341/144 |
| 5,764,173 | 6/1998 | Flynn | 341/152 |
| 5,802,187 | 9/1998 | Hsu | 381/119 |

*Primary Examiner*—Brian Young
*Assistant Examiner*—Jason L W Kost

[57] ABSTRACT

An arrangement and method for producing a plurality of pulse width modulated outputs, comprising: receiving values representative of durations of pulses to be generated at the outputs (210); producing values representative of the time differences (230) between transitions of pulses to be produced; and producing transitions in the pulses in the plurality of channels at times corresponding to the time Difference values.

5 Claims, 2 Drawing Sheets

ARRANGEMENT AND METHOD FOR PRODUCING A PLURALITY OF PULSE WIDTH MODULATED SIGNALS

FIELD OF THE INVENTION

This invention relates to the production of a plurality of channels of pulse width modulated (PWM) signals.

BACKGROUND OF THE INVENTION

Pulse width modulation is widely used in Digital-to-Analogue (D-A) conversion. In order to convert a series of digital values into analogue form using pulse width modulation, the digital values are used to modulate the widths of a stream of pulses, which is then low-pass filtered to produce a continuously varying analogue signal. Such a technique is widely used in voice applications to generate an analogue voice signal from a series of digital values. Such D-A conversion using pulse width modulation can be performed in hardware (requiring a hardware PWM generator incorporating a hardware timer) or software (requiring a hardware timer under software control).

It is often necessary to generate a plurality of (channels of sound. Conventionally, to generate a plurality of sound channels in hardware requires a dedicated hardware PWM generator (with its hardware timer) for each channel. Although such an approach requires minimal software control, it is expensive to produce in integrated circuit form since the circuit area required is proportional to the number of channels/PWM generators needed. Conventionally, to generate a plurality of sound channels in software still requires a dedicated hardware timer for each channel, and an additional hardware timer for overall PWM system operation. Although such an approach involves moderate software control, and requires less circuit area than the previously discussed hardware implementation, it is expensive to produce in integrated circuit form since the circuit area required is still highly dependent on the number of channels/hardware timers needed.

It is an object of this invention to provide an arrangement and method for producing a plurality of pulse width modulated signals, which can be implemented largely in software, and in which the above disadvantages may be alleviated.

BRIEF SUMMARY OF THE INVENTION

In accordance with a first aspect of the present invention there is provided an arrangement for producing from a plurality of series of digital values a plurality of corresponding pulse width modulated analogue signals in which pulse widths are modulated in accordance with the digital values in the respective series as claimed in claim 1.

In accordance with a second aspect of the present invention there is provided a method of producing from a plurality of series of digital values a plurality of corresponding pulse width modulated analogue signals in which pulse widths are modulated in accordance with the digital values in the respective series as claimed in claim 5.

BRIEF DESCRIPTION OF THE DRAWINGS

One embodiment of the invention will now be more fully described, by way of example only, with reference to the accompanying drawings, in which.

DETAILED DESCRIPTION OF THE DRAWINGS

Figure 1:
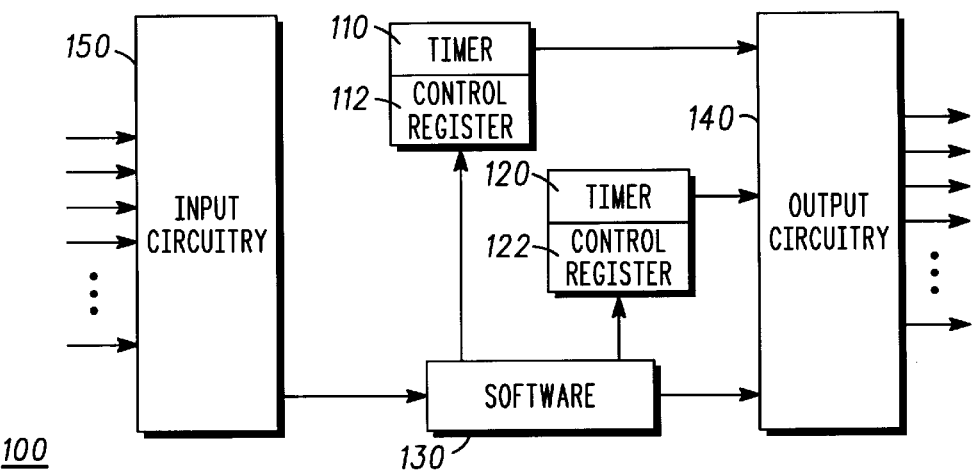
FIG. 1 shows a block diagram of an arrangement for producing n pulse width modulated analogue signals.

Referring to FIG. 1, an arrangement 100 for producing n pulse width modulated analogue signals includes a first timer 110, a second timer 120 and respective control registers 112 and 122. The control registers 112 and 122 are controlled by software 130 (whose operation will be Discussed in more detail below), which also controls output circuitry 140 and input circuitry 150.

Figure 2:
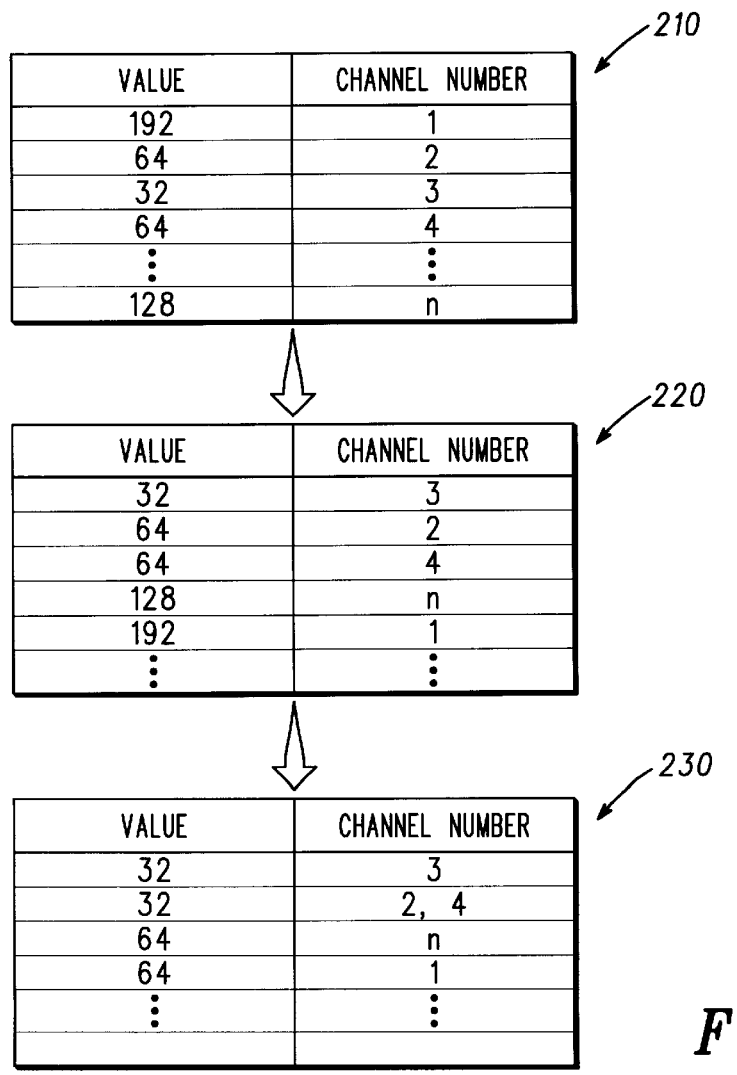
FIG. 2 shows steps in the method used in the arrangement of FIG. 1.

Referring now also to FIG. 2, n streams of digital values are received by the arrangement 100. Under the control of the software 130, every 62.5 µs the value received in each stream is stored in a memory table 210. The received values in the memory table 210 thus represent the levels, at the same point in time, of the analogue signals to be generated. Also stored in the table 210 with each received value is the number of the channel from which the value was received. Thus, the table 210 holds n rows of data, each row holding the channel number and the value received from that channel. In the example illustrated, five of the n received values are shown: values 192, 64, 32 and 64 received in channels 1, 2, 3 and 4 respectively, and value 128 received in channel n. It may be noted that the received values are 8-bit binary values, and so represent proportions of 75%, 25%, 12.5%, 25% and 50% respectively of the maximum possible level for the channels 1, 2, 3, 4 and n.

The rows of the table 210 are sorted in ascending order according to the magnitudes of the received values to produce a sorted table 220. From table 220 a time difference table 230 is then generated, with each row of the time difference table 230 holding a value given by the difference between received values in successive rows of the sorted table. Also stored in the table 230 with each difference value is the number or numbers of the channel or channels to which the difference value relates. Thus, in the example illustrated, the received values for the channels 1, 2, 3, 4 and n in the table 220 give rise to the four rows shown in the table 230:

the first row holds a value 32 (the difference between zero and the value in the first row of the table 220) and the channel number 3;

the second row holds a value 32 (the difference between the values in the first and second rows of the table 220, and also the difference between the values in the first and third rows of the table 220) and the channel numbers 2 and 4;

the third row holds a value 64 (the difference between the values in the third and fourth rows of the table 220) and the channel number n; and the fourth row holds a value 64 (the difference between the values in the third and fourth rows of the table 220) and the channel number 1.

Figure 3:
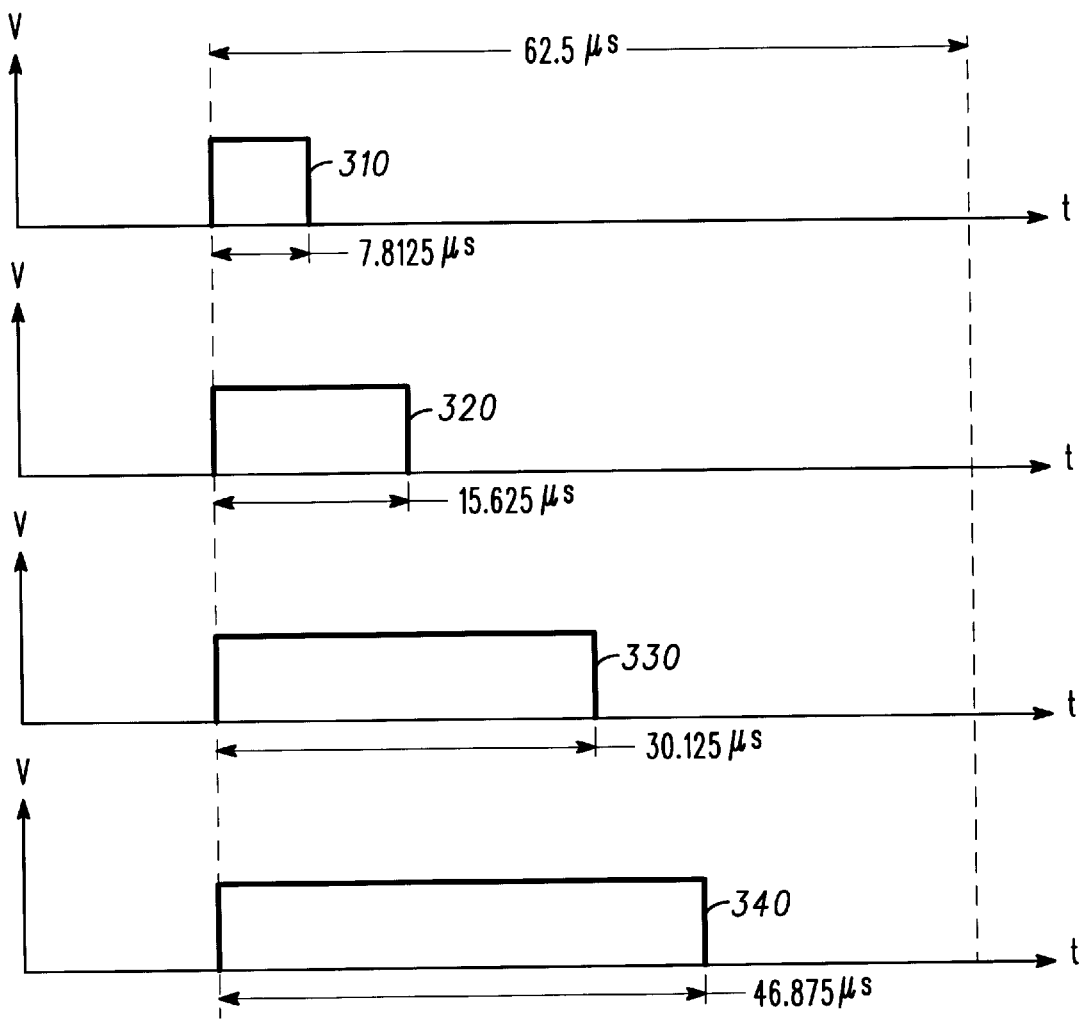
FIG. 3 shows waveform diagrams of pulse width modulated analogue signals produced by the arrangement, of FIG. 1.

Referring now also to FIG. 3, the data held in the rows of the time difference table 230 control the operation of the output circuitry 140 as follows. At the beginning of each cycle (in the present example every 62.5 µs) the timer 110 produces an output which causes a rising pulse transition to a fixed voltage level to be generated on all n channels. The output of the timer 110 also causes the time difference value in the first row of the table 230 (in the present example the value 32) to be loaded into the timer 120, and also causes the output circuitry to enable the output of the channel whose number (in the present example channel number 3) is stored in the first row of the table 220. The counter 120 then counts down (at a rate of 256 counts every 62.5 µs in the present example). When the timer 120 reaches zero (in the present example after 7.8125 µs) it produces its output, which causes a falling pulse transition to be generated on the enabled channel number from the first row of the table 230 (in the present example channel number 3). Thus the output pulse waveform 310 is produced on channel number 3 having a duration of 7.8125 µs.

This output of the timer 120 also causes the time difference value in the second row of the table 230 (in the present example the value 32) to be loaded into the timer 120, and also causes the output circuitry to enable the output of the channels whose numbers (in the present example channels number 2 and 4) are stored in the second row of the table 220. The counter 120 then counts down, and when it reaches zero (in the present example after 7.8125 µs) it produces its output, which causes a falling pulse transition to be generated on the enabled channel numbers from the second row of the table 230 (in the present example channels number 2 and 4). Thus the output pulse waveform 320 is produced, on channel number 2 and on channel number 4, having a duration of 15.625 µs.

This output of the timer 120 also causes the time difference value in the third row of the table 230 (in the present example the value 64) to be loaded into the timer 120, and also causes the output circuitry to enable the output of the channel whose number (in the present example channel number n) is stored in the third row of the table 220. The counter 120 then counts down, and when it reaches zero (in the present example after 15.625 µs) it produces its output, which causes a falling pulse transition to be generated on the enabled channel number from the second row of the table 230 (in the present example channel number n). Thus the output pulse waveform 330 is produced on channel number n having a duration of 31.25 µs.

This output of the timer 120 also causes the time difference value in the fourth row of the table 230 (in the present example the value 64) to be loaded into the timer 120, and also causes the output circuitry to enable the output of the channel whose number (in the present examples (channel number 1) is stored in the fourth row of the table 220. The counter 120 then counts down, and when it reaches zero (in the present example after 15.625 µs) it produces its output, which causes a falling pulse transition to be generated on the enabled channel number from the second line of the table 230 (in the present example channel number 1). Thus the output pulse waveform 340 is produced on channel number 1 having a duration of 46.875 µs.

This output of the timer 120 then causes the time difference value in the next row (not shown) of the table 230 to be loaded into the timer 120, and also causes the output circuitry to enable the output of the channel whose number is stored in that row of the table 220. The counter 120 then counts down, and when it reaches zero it produces its output, which causes a falling pulse transition to be generated on the enabled channel number. This process then continues with each remaining row of the table 230 until all rows have been used.

When, 62.5 µs after it last produced its output, the timer 110 times out, it causes the next set of digital values (representing, the levels, at the next point in time, of: the analogue signals to be generated) to be loaded from the n input streams into the table 210, overwriting previous data in the table. As described above, the rows of this table are then sorted to produce the sorted table 220), and this is used to generate anew the time difference table 230. The timer 110 produces its output which causes the output circuitry 140 to drive high the signal level on all of the n channels, the time difference from the first row of the table 230 is loaded into timer 120, and the process continues as described above.

In this way, in each cycle, an output pulse is produced on each of the n output channels which has the desired duration represented by the digital value input for that channel. These PWM output signals are low-pass filtered (in known manner) to produce the desired n channel analogue output signals.

Thus, it will be appreciated, the arrangement described above allows many channels of PWM analogue signals to be produced, while requiring only two timers and involving only a moderate amount of software overhead to sort the input values and derive differences therebetween. It will therefore be understood that the arrangement can be produced relatively inexpensively in integrated circuit form, since it need occupy little circuit area.

It will also be appreciated that the arrangement described above provides flexibility in allowing the number of channels of generated PWM analogue signals to be varied without requiring additional hardware.

Variations from the described arrangement and method will be apparent to a person of ordinary skill in the art, and it is intended that the present invention includes within its scope all such variations as are covered by the following claims.

What is claimed is:

1. An arrangement for producing from a plurality of series of digital values a plurality of corresponding pulse width modulated analogue signals in which pulse widths are modulated in accordance with the digital values in the respective series, the arrangement comprising:

time difference means for producing values representative of the time differences between transitions of pulses to be produced in the plurality of channels; and timer means coupled to the time difference means for generating pulses in the plurality of channels and for producing transitions in the pulses in respective ones of the plurality of channels at times corresponding to the values produced by the time difference means.

2. An arrangement as claimed in claim 1 wherein the timer means comprises:

a first timer for periodically generating a pulse transition of a first predetermined polarity synchronously in each of the plurality of analogue signals; and a second timer for producing a pulse transition of a second predetermined polarity opposite to the first predetermined polarity in respective ones of the plurality of analogue signals at times corresponding to the values produced by the time difference means.

3. An arrangement as claimed in claim 1 wherein the time difference means comprises:

sorting means for sorting received digital values into magnitude order; and differential means coupled to the sorting means for generating from the sorted digital values the time difference values.

4. An integrated circuit containing the arrangement as claimed in claim 2.

5. A method of producing from a plurality of series of digital values a plurality of corresponding pulse width modulated analogue signals in which pulse widths are modulated in accordance with the digital values in the respective series, the method comprising:

receiving the plurality of series of digital values representative of the analogue signals at a range of points in time;

generating from the received plurality of series of digital values, for each value representative of the same point in time, a first series of values ordered in magnitude;

generating from the first series of values a second series of values representative of the differences between the values of the first series;

generating synchronously in each of the plurality of analogue signals, for each point in time represented in the received plurality of series of digital values, a pulse transition of a first predetermined polarity; and generating in respective ones of the plurality of analogue signals, at times represented by respective values of the second series, pulse transitions of a second predetermined polarity opposite to the first predetermined polarity.

\* \* \* \* \*